(12) United States Patent
Sim et al.

(10) Patent No.: US 7,781,899 B2
(45) Date of Patent: Aug. 24, 2010

(54) LEADFRAME HAVING MOLD LOCK VENT

(75) Inventors: Lee Teck Sim, Malacca (MY); Yong Wae Chet, Malacca (MY); Bernd Goller, Otterfing (DE); Lim Boon Kian, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 176 days.

(21) Appl. No.: 12/038,458

(22) Filed: Feb. 27, 2008

(65) Prior Publication Data

US 2009/0212404 A1    Aug. 27, 2009

(51) Int. Cl.
*H01L 23/552* (2006.01)
*H01L 23/48* (2006.01)
*H01R 9/00* (2006.01)

(52) U.S. Cl. .................. 257/787; 257/666; 257/667; 257/E23.043; 257/E21.502; 438/123

(58) Field of Classification Search ................ 257/666, 257/667, 787, E23.043, E21.502; 438/123; 361/813
See application file for complete search history.

(56) References Cited

U.S. PATENT DOCUMENTS

| 5,501,587 | A | 3/1996 | Kwak |
| 6,038,136 | A | 3/2000 | Weber |
| 6,661,083 | B2 | 12/2003 | Lee et al. |
| 6,713,849 | B2 * | 3/2004 | Hasebe et al. ............... 257/667 |
| 2004/0253763 | A1 | 12/2004 | Punzalan et al. |
| 2007/0190694 | A1 | 8/2007 | Punzalan et al. |

FOREIGN PATENT DOCUMENTS

WO    0143518    6/2001

\* cited by examiner

*Primary Examiner*—Fernando L Toledo
(74) *Attorney, Agent, or Firm*—Dicke, Billig & Czaja, PLLC (57) ABSTRACT

A leadframe for supporting a semiconductor chip, the leadframe including a die pad having a first major surface and an opposing second major surface defining a thickness and having at least one perimeter edge, and an opening spaced from the at least one perimeter edge and extending through the thickness of the die pad between the first and second major surfaces. A vent extends from the at least one perimeter edge to the opening so that the opening is in communication with the at least one perimeter edge.

21 Claims, 11 Drawing Sheets

LEADFRAME HAVING MOLD LOCK VENT

BACKGROUND

Various semiconductor chip packages are known which provide support for an integrated circuit chip or die and associated bond wires, provide protection from hostile environments, and enable surface mounting of the die to and interconnection with a printed circuit board. One package configuration includes a leadframe having a die pad and wire bond pads, with the die being bonded to the die pad and being electrically coupled to the wire bond pads via bonding leads or wires. An encapsulating material, such as plastic, epoxy, or resin, for example, is formed over the die and bonding wires and a portion of the die pad and wire bond pads and fills a space between the die and wire bond pads.

To better ensure that the encapsulating material does not pull away or separate from the die pad, one package configuration includes a mold lock opening which extends through the die pad and is wider on a surface of the die pad opposite the die. During the packaging process, the liquid encapsulating material fills the mold lock opening so that after curing or hardening, the encapsulating material is mechanically coupled to the die pad. However, during subsequent attachment of the chip package to a printed circuit board (PCB), which is typically achieved using reflow soldering techniques, solder does not adhere to the encapsulating material filling the mold lock opening.

SUMMARY

One embodiment provides a leadframe for supporting a semiconductor chip, with the leadframe including a die pad having a first major surface and an opposing second major surface defining a thickness and having at least one perimeter edge. An opening is spaced from the at least one perimeter edge and extends through the thickness of the die pad between the first and second major surfaces. A vent extends from the at least one perimeter edge to opening so that the opening is in communication with the at least one perimeter edge.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
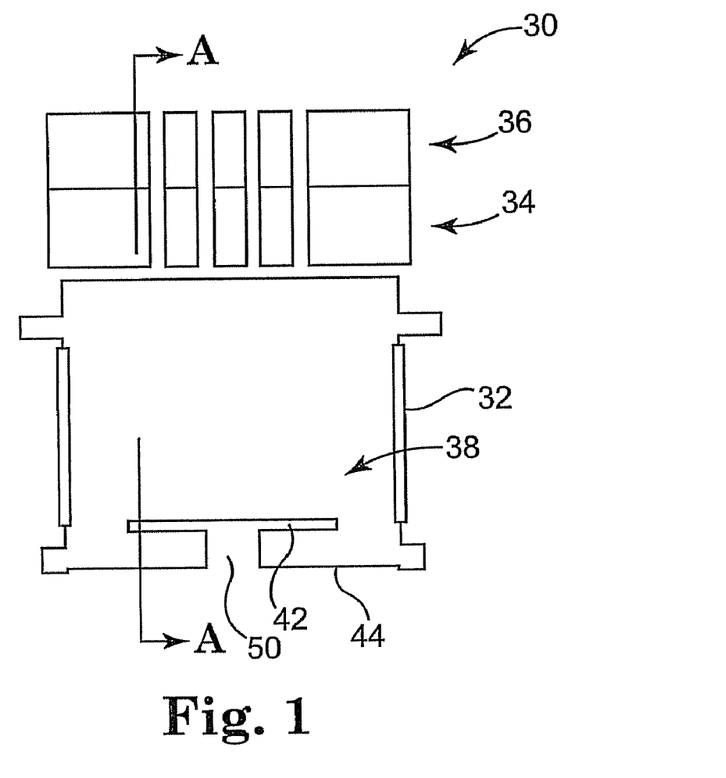
FIG. 1 is a top view illustrating a leadframe according to one embodiment.

FIG. 1 is a top view illustrating a leadframe 30 for supporting a semiconductor chip and employing a mold lock opening and air vent according to one embodiment. In one embodiment, as illustrated, leadframe 30 comprises a leadless type leadframe. Leadframe 30 includes a die pad 32 and a plurality of wire bond pads 34 which extend to a plurality of leads 36. Leadframe 30 has a front or top surface 38 which, as will be described in greater detail below, is configured to receive and mechanically bond to a semiconductor chip, and a rear or bottom surface 40 (see FIG. 2) which is configured to bond to an attachment surface, such as a printed circuit board (PCB) for example. Die pad 32 includes a mold lock opening 42 spaced from a perimeter edge 44 of die pad 32 opposite of wire bond pads 34.

Figure 2:
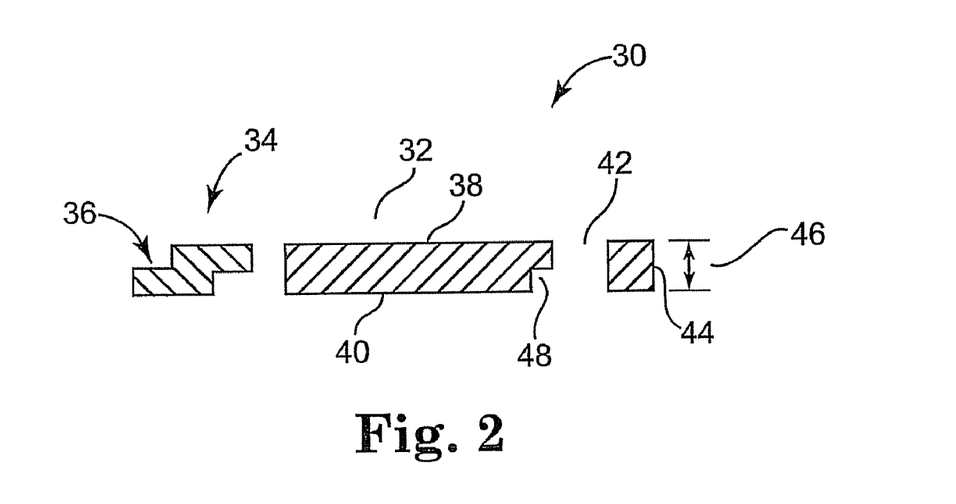
FIG. 2 is a cross-sectional view of the leadframe of FIG. 1.

FIG. 2 is a cross-sectional view "A-A" of leadframe 30 of FIG. 1 further illustrating mold lock opening 42. As illustrated, mold lock opening 42 extends from top surface 38 to bottom surface 40 through a thickness 46 of die pad 32. In one embodiment, mold lock opening 42 includes a mold lock notch 48 along bottom surface 40 so that mold lock opening 42 is larger or has a greater area proximate to bottom surface 40 than to top surface 38. As will be described in greater detail below, mold lock opening 42 is configured to receive and engage an encapsulation material during a semiconductor package fabrication process. Although illustrated as being rectangular in shape, mold lock opening 42 may be of other shapes as well.

A vent 50 extends from perimeter edge 44 to mold lock opening 42 so that mold lock opening 42 is in communication with perimeter edge 44 of die pad 32. In one embodiment, as illustrated by FIG. 1, vent 50 extends through the entire thickness 46 of die pad 32 from top surface 38 to bottom surface 40. As will be described in greater detail below, vent 50 provides escape or evacuation path for air which might otherwise be trapped below mold lock opening 42 when bottom surface 40, as part of a semiconductor package, is bonded, such as by soldering to an attachment surface of an electronic device, such as a PCB, for example.

Typically, leadframes, such as leadframe 30, are constructed from flat sheet metal (e.g. copper) by stamping or etching processes. Stamping employs die and punch sets to achieve the desired leadframe structure via one or more stamping/punching processes. Often, the intended leadframe structure is progressively achieved through a series of stamping/punching processes.

Etching typically involves selectively covering the sheet metal with a photoresist in accordance with a desired pattern of the leadframe. The sheet metal is then exposed to chemical etchants that remove areas of the sheet metal not covered by the photoresist. Similar to mechanical punching processes, the desired leadframe structure may be progressively achieved through a series of etching processes.

In one embodiment, leadframe 30, including mold lock opening 42 and vent 50, is fabricated using to stamping/punching processes. In one embodiment, leadframe 30 is fabricated through a series of stamping/punching processes. In one embodiment, mold lock opening 42 is formed by stamping recesses or steps along the perimeter edge of mold lock opening 42 so as to from mold lock notch 48.

In one embodiment, leadframe 30, including mold lock opening 42 and vent 50, is fabricated using chemical etching processes. In one embodiment, leadframe 30 is fabricated via a series of chemical etching processes. In one embodiment, the perimeter edge of mold lock opening 42 is selectively etched partially through the sheet metal (e.g. copper) of leadframe 30 so as to form mold lock notch 48 (e.g. a half-etch profile).

Figure 3:
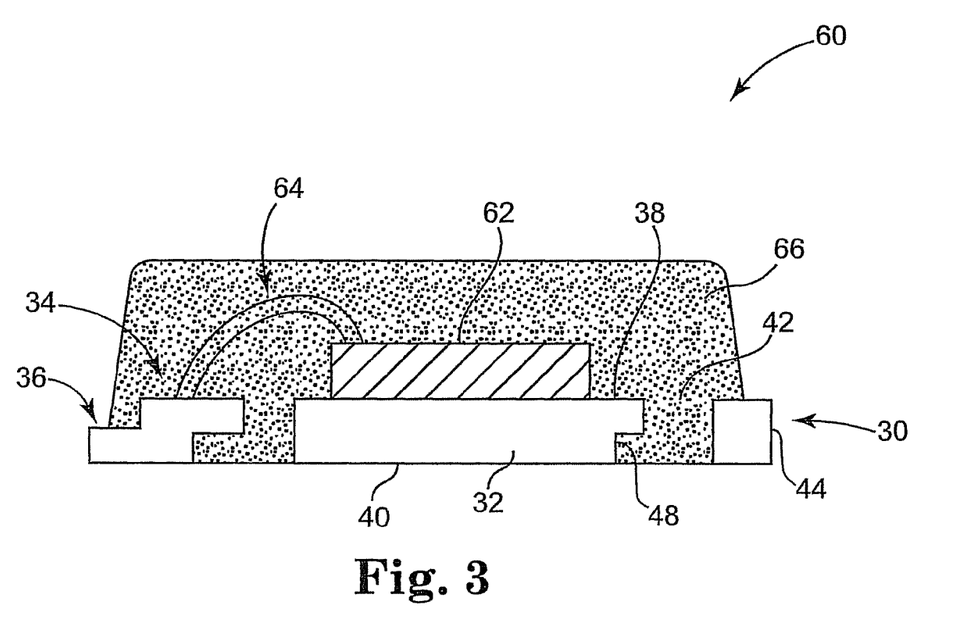
FIG. 3 is a cross-sectional view of a semiconductor package employing the leadframe of FIG. 1.
Figure 4:
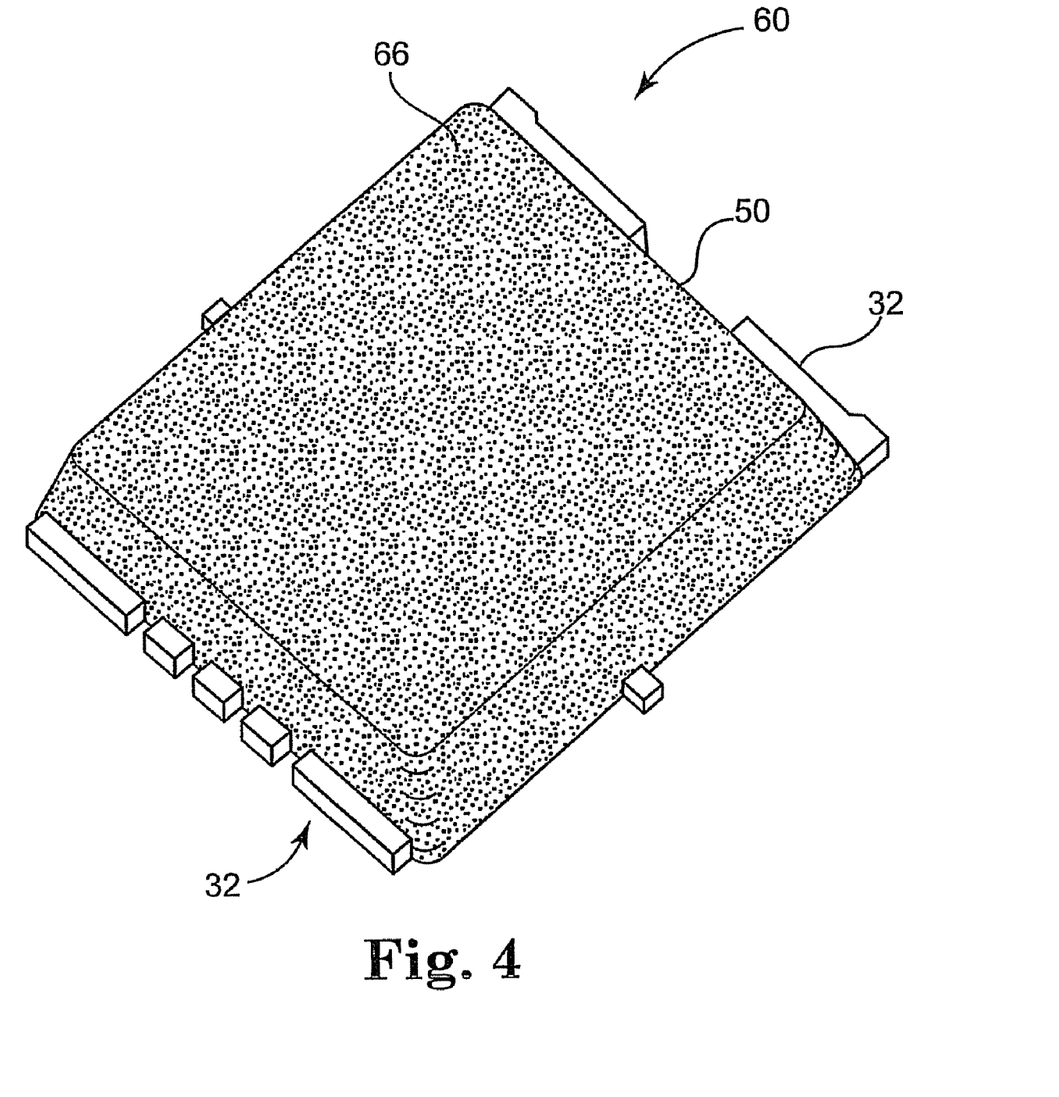
FIG. 4 is a perspective view of the semiconductor package of FIG. 3.
Figure 5:
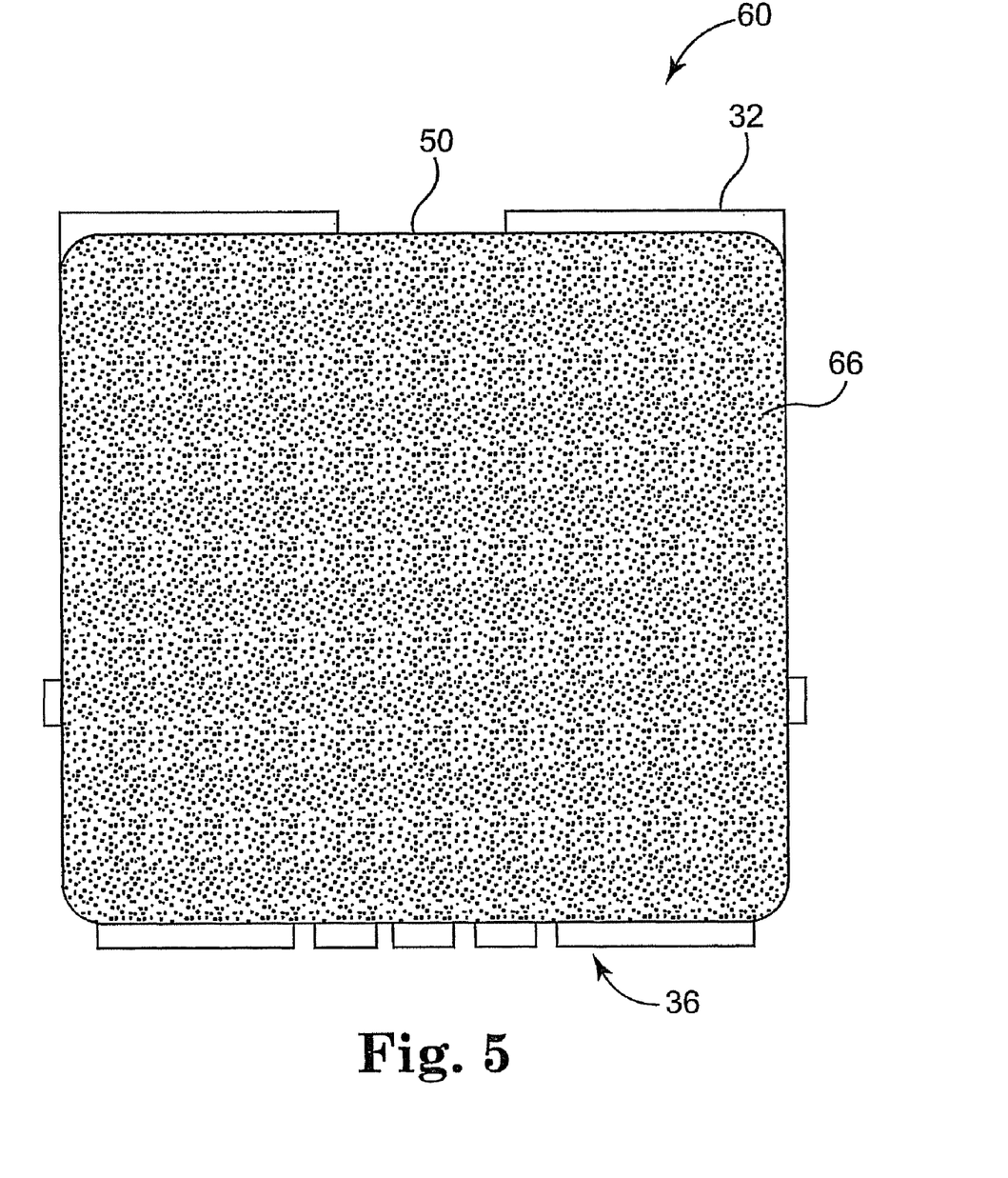
FIG. 5 is a top view of the semiconductor package of FIG. 3.
Figure 6:
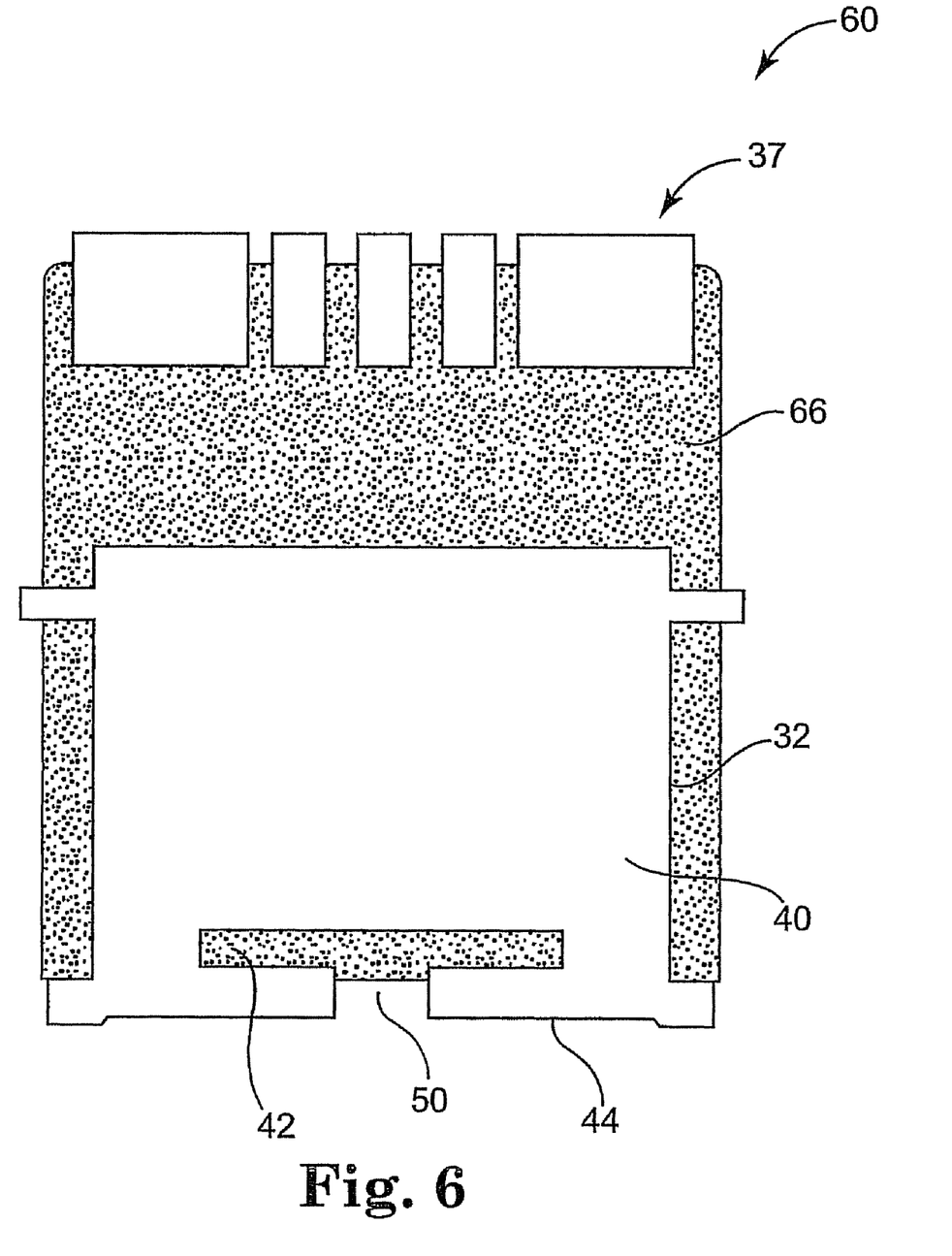
FIG. 6 is a bottom view of the semiconductor package of FIG. 3.

FIGS. 3 through 6 illustrate one embodiment of a semiconductor package 60 employing leadframe 30 as described above. FIG. 3 is a cross-sectional view generally illustrating semiconductor package 60, while FIGS. 4 through 6 respectively illustrate perspective, top, and bottom views.

With reference to FIG. 3, semiconductor package 60 includes leadframe 30 and a semiconductor chip or die 62 which is bonded to front surface 38 of die pad 32, such as with an epoxy, for example. A plurality of bonding wires 64 electrically couple die 62 to the plurality of wire bond pads 34. An encapsulating material 66, such as plastic, epoxy, or resin, for example, is formed over die 62, bonding wires 64, and wire bond pads 34, and over a portion of die pad 32 and leads 36. Encapsulating material 66 fills spaces between die 62 and die pad 32, and about bonding wires 64 and wire bond pads 34.

Encapsulating material 66 also fills all but a portion of mold lock opening 42, including mold lock notch 48 and a portion of vent 50. By being wider at bottom surface 40 than at top surface 38 (i.e. the side to which die 62 is bonded), mold lock opening 42 forms a mechanical key or interlock which captures and holds encapsulating material 66 in place and to prevent it from separating or pulling away from die and wire bond pads 32 and 34 and from die 62.

Figure 7:
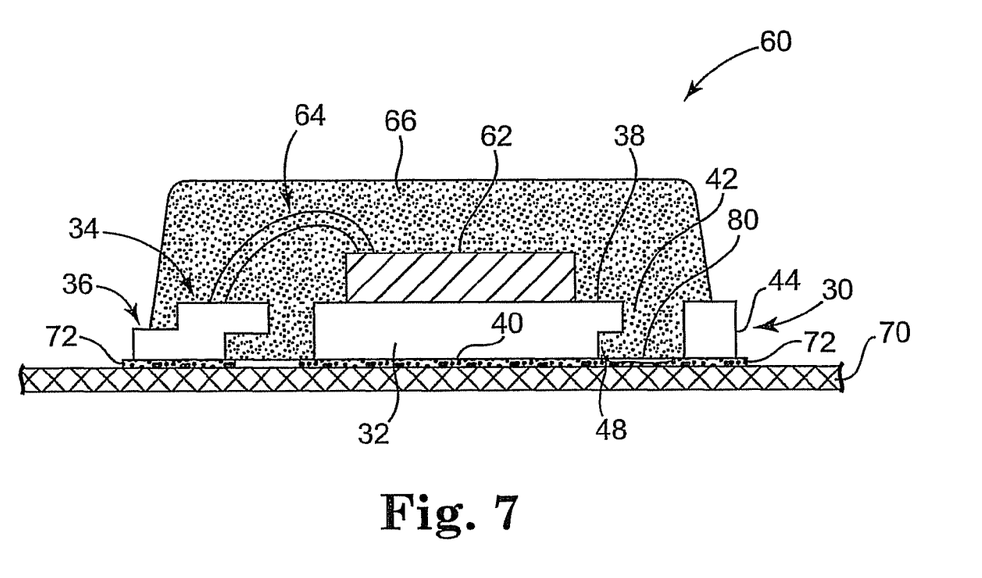
FIG. 7 is a cross-sectional view of the semiconductor package of FIG. 3 attached to a surface according to one embodiment.

FIG. 7 is a cross-sectional view of semiconductor package 60 of FIGS. 3 through 6 after being attached to an attachment surface, such as a PCB 70, of an electronic device. One conventional method for attaching semiconductor packages to PCBs, such as semiconductor package 60 to PCB 70, is to separately solder die pad 32 and each of the plurality of wire bond pads 34 to a corresponding terminal or attachment pad (e.g. a copper pad) on PCB 70 (see FIG. 8) using a reflow soldering process. During a typical reflow soldering process, solder paste is applied to the various attachment pads and the semiconductor package is positioned and aligned accordingly. The PCB and semiconductor package are then heated in an oven to melt solder particles in the paste and form solder bonds (i.e. metallurgical bonds) between the semiconductor package and PCB, such as illustrated by solder bonds 72 between semiconductor package 60 and PCB 70.

Figure 8:
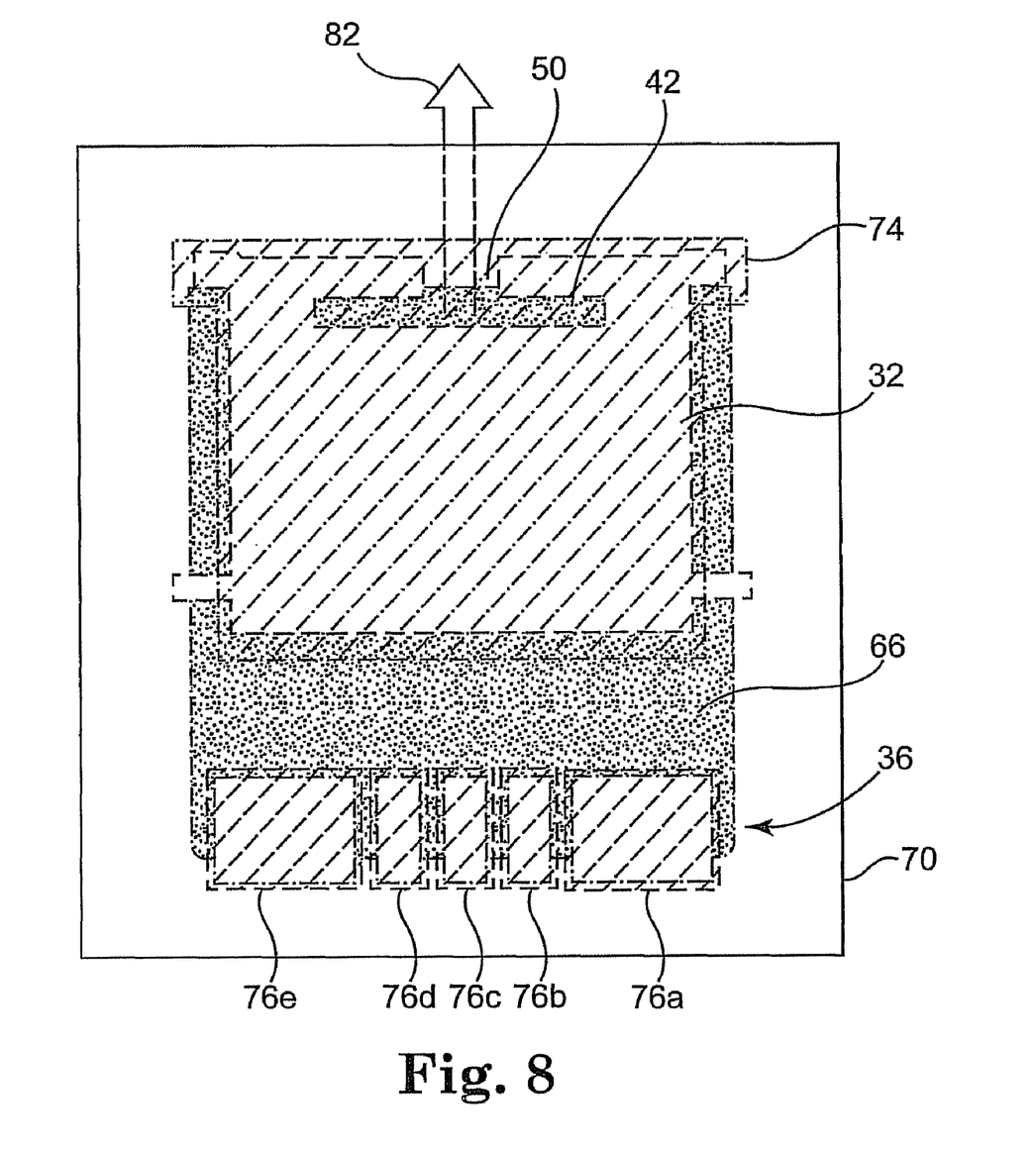
FIG. 8 is bottom view of the semiconductor package attached to a surface as shown by FIG. 7.
Figure 9:
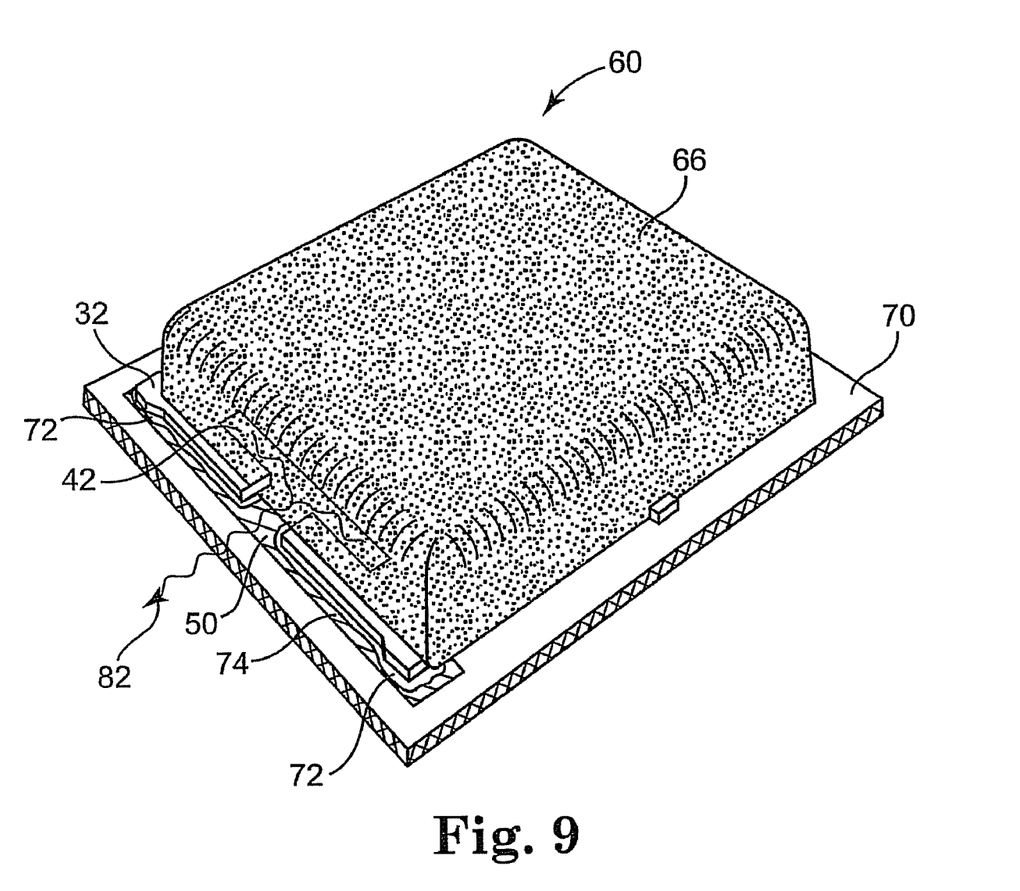
FIG. 9 is a perspective view of the semiconductor package attached to a surface as shown by FIG. 7.

FIGS. 8 and 9 respectively illustrate bottom and perspective views of semiconductor package 60 of FIG. 7 after being been solder-bonded to PCB 70. With reference to FIG. 8, which is looking through PCB 70, the hatched area represents an attachment pad 74 to which die pad 32 is solder-bonded, and hatched areas 76a to 76e represent attachment pads corresponding to each of the plurality of wire bond pads 34.

PCBs, such as PCB 70, are typically configured to accept a variety of semiconductor packages so that the attachment pads, such as attachment pads 74 and 76a to 76e on PCB 70, are not individually tailored or sized to match the dimensions of the die and wire bonding pads of a particular semiconductor package, such die and wire bond pads 32 and 34 of semiconductor package 60. Typically, the attachment pads are not modified to account for features of individual semiconductor packages, such as mold lock opening 42 of leadframe 30 of semiconductor package 60.

For example, as illustrated by FIGS. 7 and 8, PCBs, such as PCB 70, typically employ a single die attachment pad for boding to the die pad, such as attachment pad 74, which has dimensions to at least encompass the entire die pad, such as die pad 32. During the reflow soldering process, solder paste is applied across the entire die attachment pad such that the solder bond covers at least the entire bottom surface of the die pad, such as the entire bottom surface 40 of die pad 32, including the area beneath mold lock opening 42, and may even extend beyond the die pad, as illustrated by solder bond 72.

While such an approach may simplify the process of attaching or bonding semiconductor package 60 to PCB 70, it is noted that solder bond 72 does not bond or adhere to encapsulating material 66. In one embodiment, the mold lock opening has a width proximate to bottom surface 40 of leadframe 30 of only approximately 0.1 millimeters, which is approximately equal to a thickness of solder bond 72. As a result, solder bond 72 may easily bridge the width of mold lock opening 42 and a gap may form between encapsulating material 66 within mold lock opening 42 and solder bond 72 in which air pockets, such as air pocket 80, may be trapped during the solder reflow process. These trapped air pockets may also migrate within the liquid solder during the reflow process and, in a worst case, travel to a center region below die pad 32. Thermal expansion of such trapped air pockets, such as air pocket 80, during subsequent operation of semiconductor package 60 could lead to cracking of solder bond 72, thereby compromising operational reliability by weakening or destroying both the mechanical and electrical connection between semiconductor package 60 and PCB 70.

Figure 10:
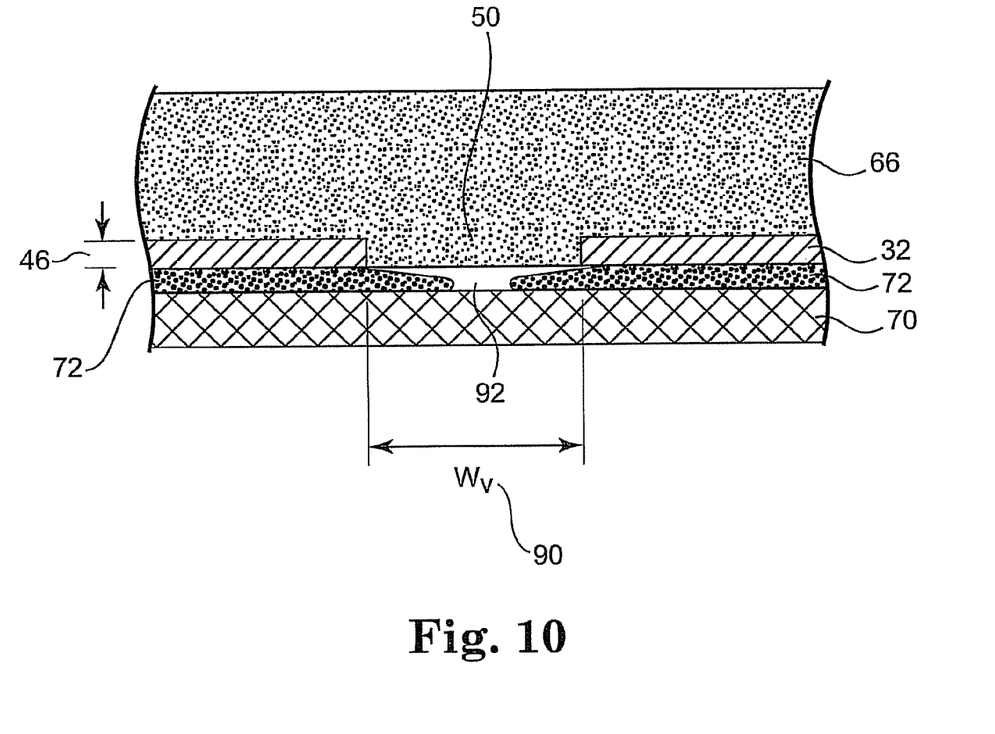
FIG. 10 is a side view of a portion of the semiconductor package attached to a surface as shown by FIG. 7 and illustrating a vent according to one embodiment.

FIG. 10 is an end or side view of semiconductor package 60 of FIGS. 7-9 further illustrating vent 50, according to one embodiment. As illustrated, vent 50 extends through the entire thickness 46 of leadframe 30 and has a width, $W_V$, as illustrated at 90. During the process of forming encapsulating material 66 about semiconductor chip 62 and bonding wires 64 on top surface 38 of leadframe 30, encapsulating material 66 fills at least a portion of vent 50. However, because the solder of solder bond 72 does not adhere or bond to encapsulating material 66, a solder-free gap 92 is maintained between encapsulating material 66 filling vent 50 and solder-bond 72.

In one embodiment, as illustrated by FIG. 10, width $W_V$ 90 of vent 50 is at least wide enough to prevent the solder of solder-bond 72 from bridging the width $W_V$ 90 of the vent 50 so that at least a portion of vent 50 is free of solder between encapsulating material 66 and circuit board 70. In one embodiment, width $W_V$ 90 is greater than a thickness of solder bond 72. However, even if the solder of solder-bond 72 completely bridges width $W_V$ 90, a solder-free gap will still exist between encapsulating material 66 filling vent 50 and solder bond 72. In one embodiment, vent 50 has a width $W_V$ 90 of 1 millimeter (mm). In one embodiment, vent 50 has a width in a range from 0.5 mm to 1.5 mm.

By providing a pathway which is unblocked by solder bond 72 between mold lock opening 42 and perimeter edge 44 of leadframe 30, vent 50 provides an evacuation path which enables air of air pocket 80 to be escape from mold lock opening 42, as illustrated by arrow 82 (see FIGS. 8 and 9), that might otherwise be trapped below mold lock opening 42 during the reflow soldering process when attaching semiconductor package 60 to PCB 70. As such, vent 50 reduces the potential for cracking of solder bond 72 between die pad 32 and PCB 70 and increases the reliability of the connection of semiconductor package 60 to PCB 70 and, thus, the reliability of a device of which PCB 70 is a part.

Figure 11:
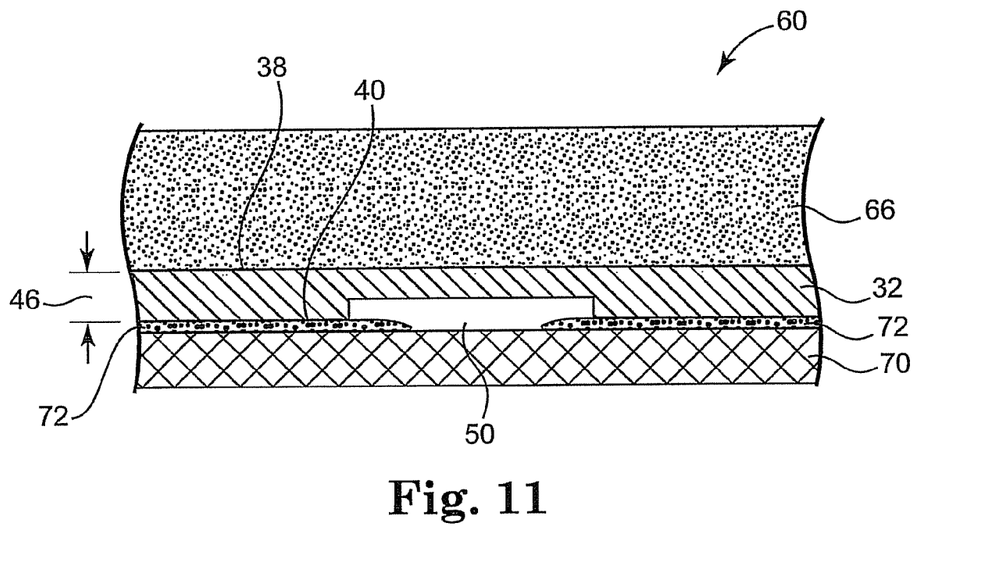
FIG. 11 is a side view of a portion of the semiconductor package attached to a surface as shown by FIG. 7 and illustrating a vent according to another embodiment.

FIG. 11 is a side view of semiconductor package 60 of FIGS. 7-9 further illustrating another embodiment of vent 50. As illustrated, in lieu of extending through the entire thickness 46 of die pad 32 between top and bottom surfaces 38 and 40, vent 50 extend only partially through thickness 46 so as to form a channel in bottom surface 40 from perimeter edge 44 to mold lock opening 42.

Figure 12:
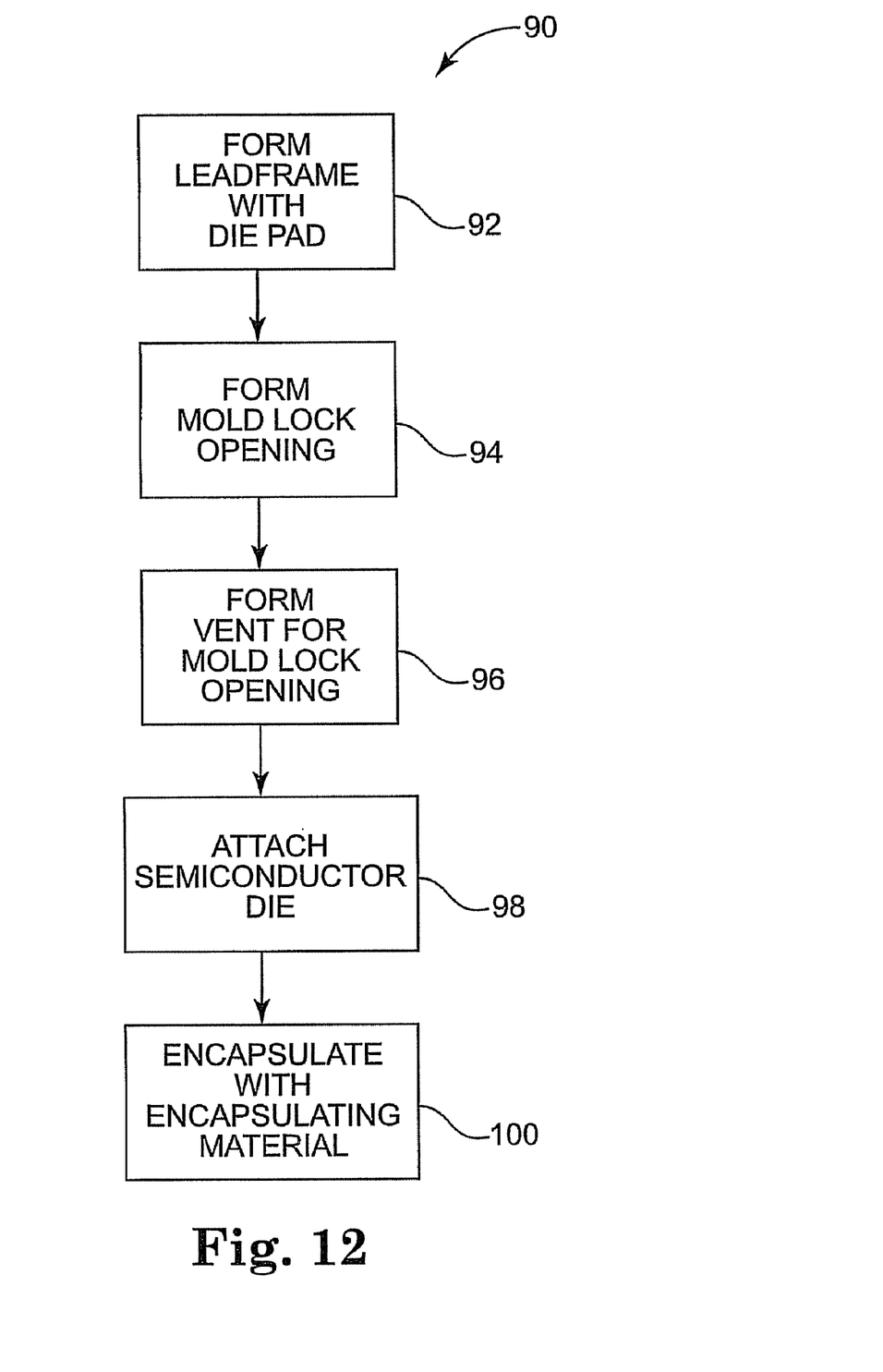
FIG. 12 is a flow diagram generally describing a molding process according to one embodiment.

FIG. 12 is a flow diagram generally illustrating a process 90 for forming a semiconductor package employing a leadframe having a mold lock opening and vent, such as semiconductor package 60 and leadframe 30. Process 90 begins at 92 by forming a leadframe having a plurality of wire bond pads and leads, and including a die pad having a first major surface and an opposing second major surface defining a thickness, and including at least one perimeter edge, such as illustrated above by leadframe 30.

At 94, a mold lock opening is formed through the thickness of the die pad between the first and second major surfaces and is spaced from the perimeter edge, such as mold lock opening 42 of die pad 32. At 96, a vent is formed through the die pad from the mold lock opening to the perimeter edge so that the mold lock opening is in communication with the perimeter edge, such as vent 50. In one embodiment, the vent extends through the entire thickness of the die pad between the first and second major surfaces. In one embodiment, the vent extends only partially through the thickness of the die pad so that the vent forms a channel in the second major surface between the mold lock opening and the perimeter edge. Although illustrated separately, it is noted that, in other embodiments, 94 and 96 may be included with 92.

At 98, a semiconductor chip or die is bonded to the die pad formed at 92 including coupling a plurality of bonding wires between the semiconductor die and the wire bond pads, such as illustrated above by FIG. 3. In one embodiment, process 90 concludes at 100 by encapsulating the semiconductor die and wire bond pads and at least of portion of the die pad and leads with an encapsulating material, such as illustrated above by FIGS. 3 through 7.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A leadframe for supporting a semiconductor chip, the leadframe comprising:
    a die pad including a first major surface and an opposing second major surface defining a thickness and having at least one perimeter edge, wherein the first major surface is configured to receive and be bonded to the semiconductor chip;
    a mold lock opening spaced from the at least one perimeter edge and outside of a bonding position of the semiconductor chip, the opening extending through the thickness of the die pad and through the first and second major surfaces, the mold lock opening having a greater area at the second major surface than at the first major surface; and
    a vent extending through the second major surface and at least partially through the thickness of the die pad and extending through the at least one perimeter edge and to the mold lock opening such that the vent comprises a channel in the second surface via which the mold lock opening is in communication with the at least one perimeter edge.

2. The leadframe of claim 1, wherein the vent extends through the thickness of the die pad and through the first major surface.

3. The leadframe of claim 1, wherein the vent has a length extending between the mold lock opening and the at least one perimeter edge and a width in a range from 0.5 to 1.5 millimeters.

4. The leadframe of claim 1, wherein the mold lock opening has a width, in a direction substantially parallel to a length of the vent, which is in a range from approximately 0.5 to 0.8 microns.

5. The leadframe of claim 1, wherein the second major surface is configured to be solder-bonded to an attachment surface, and wherein the vent has a length extending between the mold lock opening and the at least one perimeter edge and a width at least wide enough to prevent solder of a solder bond between the second major surface and the attachment surface from bridging the width of the vent.

6. The leadframe of claim 1, wherein the leadframe comprises a leadless leadframe.

7. A semiconductor package comprising:
    a leadframe including:
        a die pad including a first major surface and an opposing second major surface defining a thickness and having at least one perimeter edge;
        a mold lock opening spaced from the at least one perimeter edge and extending through the thickness of the die pad between the first and second major surfaces, the mold lock opening having a greater area at the second major surface than at the first major surface; and
        a vent extending through the second major surface and at least partially through the thickness of the die pad and extending through the at least one perimeter edge and to the mold lock opening such that the vent comprises a channel in the second surface via which the mold lock opening is in communication with the at least one perimeter edge;
    a semiconductor die attached to the first major surface, leaving the mold lock opening exposed; and an encapsulating material formed about the semiconductor die and a portion of the first major surface, including covering and filling the mold lock opening and only a portion of the vent.

8. The semiconductor package of claim 7, wherein the vent has a length extending between the mold lock opening and the at least one perimeter edge and a width in a range from 0.5 to 1.5 millimeters.

9. The semiconductor package of claim 7, wherein the vent extends through the thickness of the die pad and through the first major surface.

10. The semiconductor package of claim 7, where the second major surface is configured to be solder-bonded to an attachment surface, and where the vent has a length extending between the mold lock opening and the at least one perimeter edge and a width at least wide enough to prevent solder of a solder bond between the second major surface and the attachment surface from bridging the width of the vent.

11. The semiconductor package of claim 7, wherein the second major surface is configured to be solder-bonded to an attachment surface, and wherein the vent has a length extending between the mold lock opening and the at least one perimeter edge and a width wider than a thickness of a solder bond to be formed between the second major surface and the attachment surface.

12. The semiconductor package of claim 7, wherein the leadframe comprises a leadless leadframe.

13. A method of fabricating a semiconductor package, the method comprising:

forming a leadframe including a die pad having a first major surface and an opposing second major surface defining a thickness and having at least one perimeter edge, including forming a mold lock opening through the thickness of the die pad and through the first and second major surfaces, wherein the mold lock opening is spaced from the at least one perimeter edge and has a greater area at the second major surface than at the first major surface, and including forming a vent extending through the second major surface and at least partially through the thickness of the die pad and extending through the at least one perimeter edge to the mold lock opening to such that the vent comprises a channel in the second surface via which the mold lock opening is in communication with the at least one perimeter edge;

attaching a semiconductor die to the first major surface, leaving the mold lock opening exposed; and encapsulating the semiconductor die and a portion of the first major surface with an encapsulating material, including covering and filling the mold lock opening and only a portion of the vent with the encapsulating material.

14. The method of claim 13, wherein forming the vent includes forming the vent with having a length extending between the mold lock opening and the at least one perimeter edge and a width extending perpendicular to the length which is in a range from 0.5 to 1.5 millimeters.

15. The method of claim 13, further including forming the vent with a length extending between the mold lock opening and the at least one perimeter edge and a width extending perpendicular to the length which is at least wide enough to prevent solder of a solder bond between the second major surface and an attachment surface from bridging the width of the vent.

16. The method of claim 13, further including forming the vent through the thickness of the die pad and through the first major surface.

17. The method of claim 13, wherein the leadframe comprises a leadless leadframe.

18. The method of claim 13, wherein the leadframe is formed using punching processes.

19. The method of claim 18, wherein the mold lock opening and vent are formed via a series of punching processes.

20. The method of claim 13, wherein the leadframe is formed using etching processes.

21. The method of claim 20, wherein the mold lock opening a vent are formed via a series of etching processes.

* * * * *

UNITED STATES PATENT AND TRADEMARK OFFICE
CERTIFICATE OF CORRECTION

PATENT NO.        : 7,781,899 B2
APPLICATION NO.   : 12/038458
DATED             : August 24, 2010
INVENTOR(S)       : Lee et al.

It is certified that error appears in the above-identified patent and that said Letters Patent is hereby corrected as shown below:

On the Title Page, Item (12), please delete the following:

"Sim et al" and substitute -- Lee et al --

Item (75), please delete the following:

"Inventors: Lee Teck Sim, Malacca (MY); Yong Wae Chet, Malacca (MY); Bernd Goller, Otterfing (DE); Lim Boon Kian, Malacca (MY)"

And substitute:

-- Inventors: Teck Sim Lee, Malacca (MY); Wae Chet Yong, Malacca (MY); Bernd Goller, Otterfing (DE); Boon Kian Lim -- (As shown on the attached title page.)

Signed and Sealed this
Twenty-fourth Day of December, 2013

Margaret A. Focarino
*Commissioner for Patents of the United States Patent and Trademark Office*

(12) United States Patent
Lee et al.

(10) Patent No.: US 7,781,899 B2
(45) Date of Patent: Aug. 24, 2010

(54) LEADFRAME HAVING MOLD LOCK VENT (75) Inventors: Teck Sim Lee, Malacca (MY); Wae Chet Yong, Malacca (MY); Bernd Goller, Otterfing (DE); Boon Kian Lim, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 176 days.

(21) Appl. No.: 12/038,458

(22) Filed: Feb. 27, 2008

(65) Prior Publication Data
US 2009/0212404 A1 Aug. 27, 2009

(51) Int. Cl.
H01L 23/552 (2006.01)
H01L 23/48 (2006.01)
H01R 9/00 (2006.01)

(52) U.S. Cl. .......... 257/787; 257/666; 257/667; 257/E23.043; 257/E21.502; 438/123

(58) Field of Classification Search .......... 257/666, 257/667, 787, E23.043, E21.502; 438/123; 361/813
See application file for complete search history.

(56) References Cited

U.S. PATENT DOCUMENTS

| 5,501,587 | A | 3/1996 | Kwak |
| 6,038,136 | A | 3/2000 | Weber |
| 6,661,083 | B2 | 12/2003 | Lee et al. |
| 6,713,849 | B2 * | 3/2004 | Hasebe et al. .......... 257/667 |
| 2004/0253763 | A1 | 12/2004 | Punzalan et al. |
| 2007/0190694 | A1 | 8/2007 | Punzalan et al. |

FOREIGN PATENT DOCUMENTS

WO 0143518 6/2001

* cited by examiner

Primary Examiner—Fernando L Toledo
(74) Attorney, Agent, or Firm—Dicke, Billig & Czaja, PLLC (57) ABSTRACT

A leadframe for supporting a semiconductor chip, the leadframe including a die pad having a first major surface and an opposing second major surface defining a thickness and having at least one perimeter edge, and an opening spaced from the at least one perimeter edge and extending through the thickness of the die pad between the first and second major surfaces. A vent extends from the at least one perimeter edge to the opening so that the opening is in communication with the at least one perimeter edge.

21 Claims, 11 Drawing Sheets